United States Patent [19]
Oldfield

[11] Patent Number: 5,812,039
[45] Date of Patent: Sep. 22, 1998

[54] APPARATUS FOR PROVIDING A GROUND FOR CIRCUITS ON CARRIERS

[76] Inventor: William Oldfield, 413 Lakeview Way, Redwood City, Calif. 94062

[21] Appl. No.: 800,960

[22] Filed: Feb. 18, 1997

[51] Int. Cl.$^6$ ........................................................ H01P 1/00
[52] U.S. Cl. ........................ 333/246; 333/99 R; 361/787; 361/799
[58] Field of Search ................................ 333/12, 238, 246, 333/247, 99 R; 361/742, 787, 788, 799, 818

[56] References Cited

U.S. PATENT DOCUMENTS

| | | | |
|---|---|---|---|
| 3,747,044 | 7/1973 | Vaccaro | 361/818 X |
| 3,870,974 | 3/1975 | Ohlstein et al. | 333/12 |
| 5,065,124 | 11/1991 | Chrzan | 333/246 |

FOREIGN PATENT DOCUMENTS

| | | | |
|---|---|---|---|
| 1-233802 | 9/1989 | Japan | 333/246 |
| 2-228801 | 9/1990 | Japan | 333/260 |

*Primary Examiner*—Paul Gensler
*Attorney, Agent, or Firm*—Fliesler, Dubb, Meyer & Lovejoy LLP

[57] ABSTRACT

A ground path for microwave circuits positioned on carriers is provided. A ground path is provided between a first and second carrier coupled to respective microwave circuit substrates. The first and second carriers are coupled to a base, forming an opening between the first and second carriers. A conductive element is coupled to a first microstrip transmission line on the first substrate and a second microstrip transmission line on the second substrate. A conductive spring is then positioned in the opening in order to create a ground path. The microstrip transmission line may consist of alumina or a high-frequency plastic, such as Teflon or Duroid®. The conductive spring may consist of beryllium copper. A conductive rubber material may also be positioned in the opening, contacting the conductive spring and the base. The conductive spring and conductive element form a transmission having an impedance of between approximately 45 ohms and 60 ohms, thereby substantially improving microwave signal quality transmitted on a substrate coupled to relatively thick carriers.

22 Claims, 6 Drawing Sheets

APPARATUS FOR PROVIDING A GROUND FOR CIRCUITS ON CARRIERS

BACKGROUND OF THE INVENTION

1. Field of the Invention

The present invention relates to grounding circuits, and in particular, grounding circuits positioned on carriers.

2. Description of the Related Art

Figure 1A:
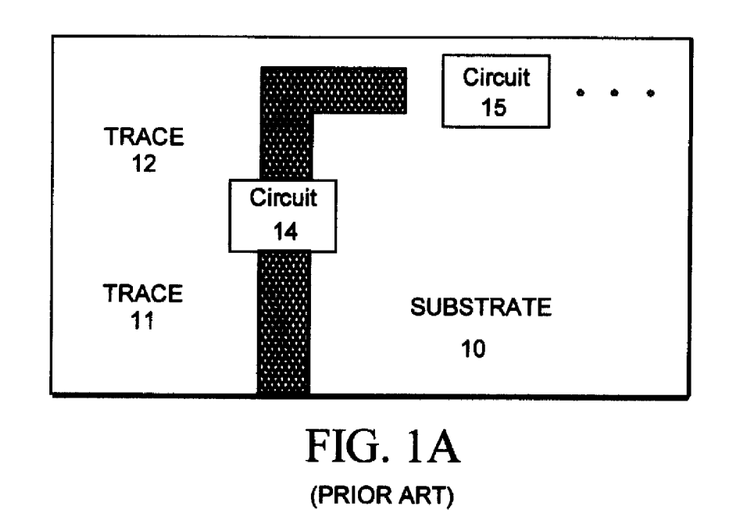
FIGS. 1a–b illustrate circuit block diagrams and traces formed on a substrate.
Figure 1B:
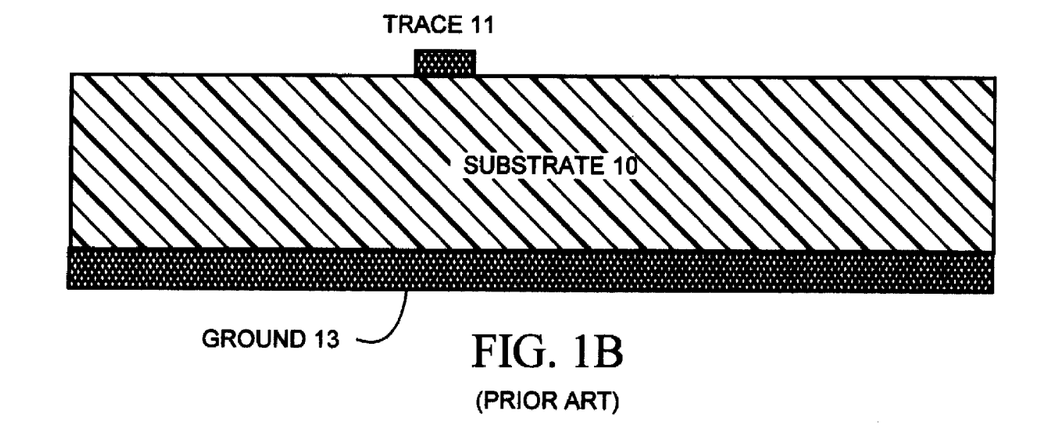

Traces are used to electrically connect electronic devices and/or circuits formed on a substrate. For example, trace 12 connects circuit 15 to circuit 14 on substrate 10, as shown in FIG. 1*a*. Likewise, trace 11, connected to circuit 14, may also be used to connect circuit 14 to other circuits which are not on substrate 10. FIG. 1*b* illustrates a cross-sectional view of substrate 10, trace 11 and ground 13. Typically, the traces have an impedance of approximately 50 ohms. Circuits 14 and 15 may be microwave circuits, such as an amplifier, antenna, filter or circulator. When using microwave circuits, traces are typically referred to as microstrip transmission lines.

Figure 2:
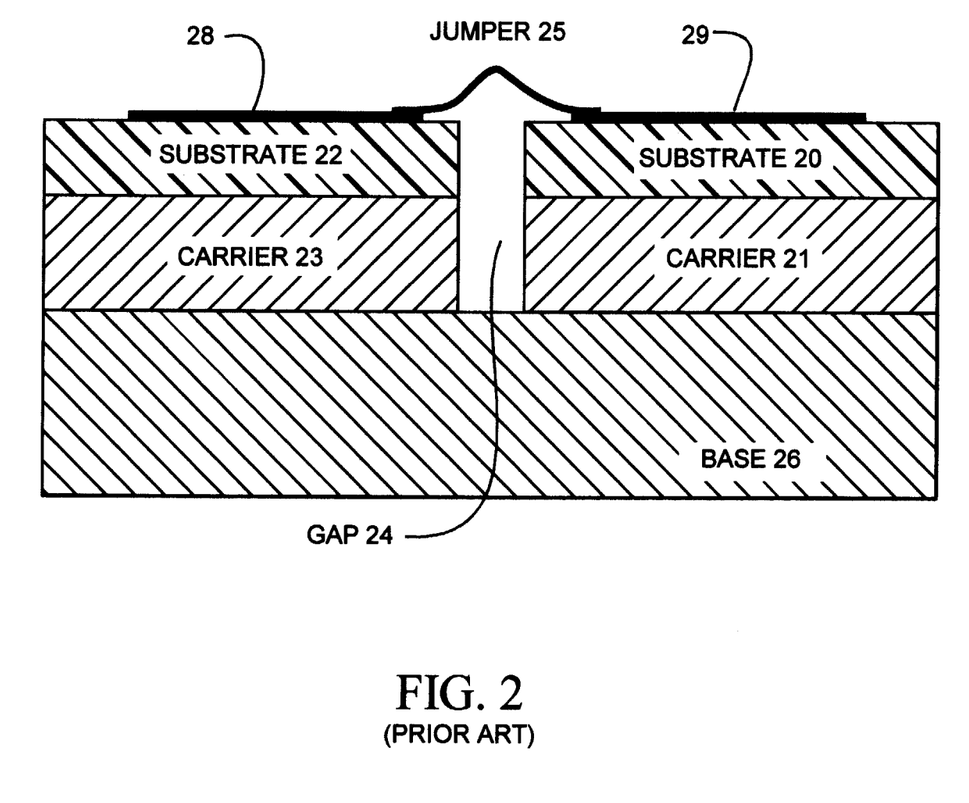
FIG. 2 illustrates using a jumper coupled to microstrip transmission lines on respective substrates.

In designing electrical systems, and in particular microwave systems, multiple substrates having electronic devices and/or circuits may be combined to form the microwave system. FIG. 2 illustrates a microwave system having, but not limited to, two substrates. Both substrate 22 and substrate 20 have at least one electronic device and/or circuit. Circuits formed on substrate 22 and substrate 20 are electrically connected by jumper 25. In particular, jumper 25 electrically couples microstrip transmission line 28 to microstrip transmission line 29. These microstrip transmission lines are then in turn coupled to the various circuits and/or electronic devices.

The impedance corresponding to jumper 24 is not the typical 50 ohm trace impedance, but considerably higher. The typical impedance of jumper 24 is approximately 100 ohms. This higher impedance will cause reflection in a transmitted signal. In particular, this reflection will increase when using high frequency signals due to the longer phase length. At frequencies above 20 gHz, appreciable reflection may be observed.

Often, substrates must be mounted on carriers. For example, substrate 22 is mounted on carrier 23, and substrate 20 is mounted on carrier 21, respectively. Carriers 23 and 21 are then coupled to base 26 acting as a ground plane.

Generally, a carrier is a piece of metal used for a variety of reasons. For example, a carrier may be coupled to a substrate to increase heat sink characteristics. A carrier may also provide a better ground for electronic devices and/or circuits on a substrate. A carrier may be used to strengthen a relatively weak substrate. Using a carrier may also be required if the substrate is coupled to a base by a screw. A carrier may also be used in order to allow for ease in replacing the substrate. If different substrate thicknesses are used, carriers may be used to create a common plane between substrate surfaces.

While the use of carriers solves many of the problems outlined above, carriers may also undesirably extend the ground path of a circuit to such an extent that signal quality is degraded. In certain applications, a ground path may be lengthened by twice the thickness of a carrier. A ground path may have to be extended down a first carrier to a ground plane and then back up a second carrier. This lengthening of the ground path is further complicated when using higher frequency microwave signals.

For example, if a 75 gHz microwave signal is transmitted on microstrip transmission line 28, jumper 25 and microstrip transmission line 29, and carrier 23 and carrier 21 have an approximate thickness of 0.5 mm (0.020 inches), the ground path length down carrier 23 to the top of base 26 and then up carrier 21 is equal to approximately a quarter of the 75 gHz wavelength. This will result in a short at a circuit on substrate 22 and an open circuit at a circuit on substrate 20.

Therefore, it is desirable to provide an apparatus including multiple substrates coupled to relatively thick respective carriers which preserves signal quality when using jumpers between substrates. Signal quality should be preserved while the electrical system benefits from the numerous advantages outlined above in regard to using carriers. In particular, a microwave system having a plurality of substrates including microwave circuits, coupled to relatively thick carriers, which preserve microwave signal quality is desirable.

SUMMARY OF THE INVENTION

An apparatus for providing a ground path for a circuit is provided. The apparatus includes a first carrier which is coupled to a first substrate having a first trace. A second carrier is coupled to a second substrate having a second trace. A base is coupled to the first carrier and the second carrier, forming an opening between the first and second carriers. A conductive element couples the first trace to the second trace. A conductive spring is positioned in the opening for creating a circuit ground.

According to another aspect of the present invention, the first and second traces are microstrip transmission lines.

According to another aspect of the present invention, the first and second traces consist of alumina.

According to another aspect of the present invention, the first and second traces consist of high-frequency plastic.

According to another aspect of the present invention, the first and second traces consist of Teflon fiberglass.

According to another aspect of the present invention, the first and second traces consist of Duroid®.

According to yet another aspect of the present invention, the conductive spring and jumper form a transmission line having an impedance of approximately between 45 and 60 ohms.

According to yet another aspect of the present invention, the conductive spring consists of beryllium copper.

According to yet another aspect of the present invention, a conductive rubber material is positioned in the opening contacting the conductive spring and the base.

According to another aspect of the present invention, an apparatus for providing the ground path for microwave circuits is provided. The apparatus comprises a first carrier coupled to a first substrate having a first microwave circuit including a first microstrip transmission line. The first carrier includes a first upper portion for positioning the first substrate and a lower portion. A second carrier is also coupled to a second substrate having a second microwave circuit including a second microstrip transmission line. The second carrier includes a first upper portion for positioning the second substrate and a lower portion. A base is coupled to the lower portions of the first and second carriers, forming a first opening between the upper portions of the first and second carriers. A second opening is also formed between the lower portions of the first and second carriers. A jumper is coupled to the first and second microstrip transmission lines. A conductive spring is positioned in the first opening for creating a circuit ground path. A conductive rubber material is positioned in the second opening. The conductive rubber material contacts the conductive spring and the base.

According to another aspect of the present invention, the conductive spring is flexible in order to be positioned into the first opening and contact the first and second substrates.

Other aspects and advantages of the present invention can be seen upon review of the figures, the detailed description, and the claims which follow.

DETAILED DESCRIPTION OF THE INVENTION

Figure 3A:
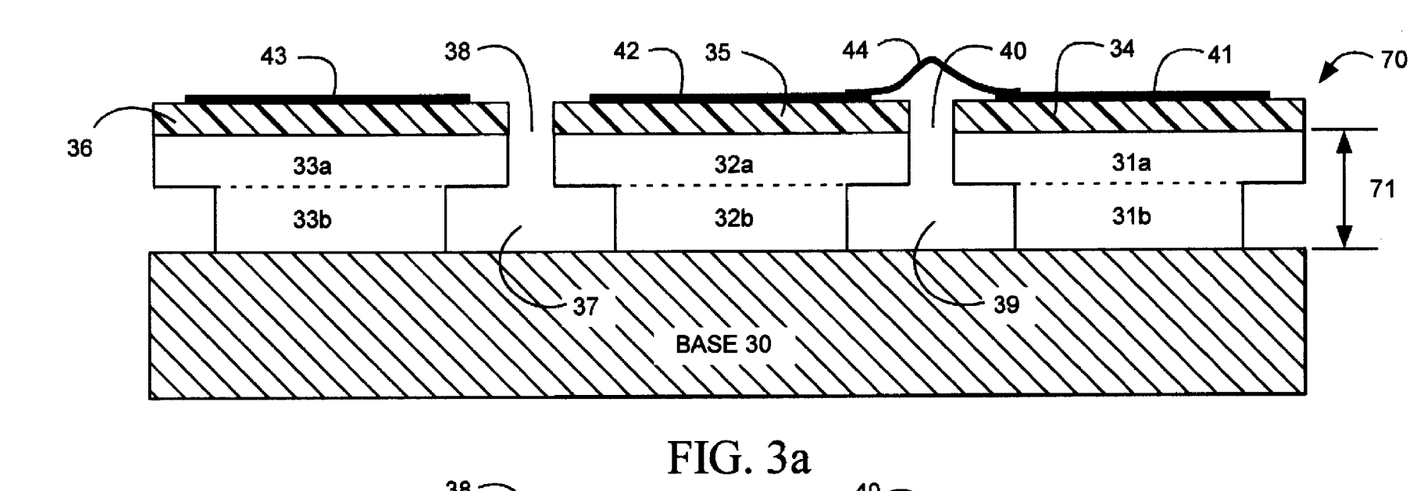
FIGS. 3a–b illustrate openings formed between carriers, substrates and a base according to the present invention.
Figure 3B:
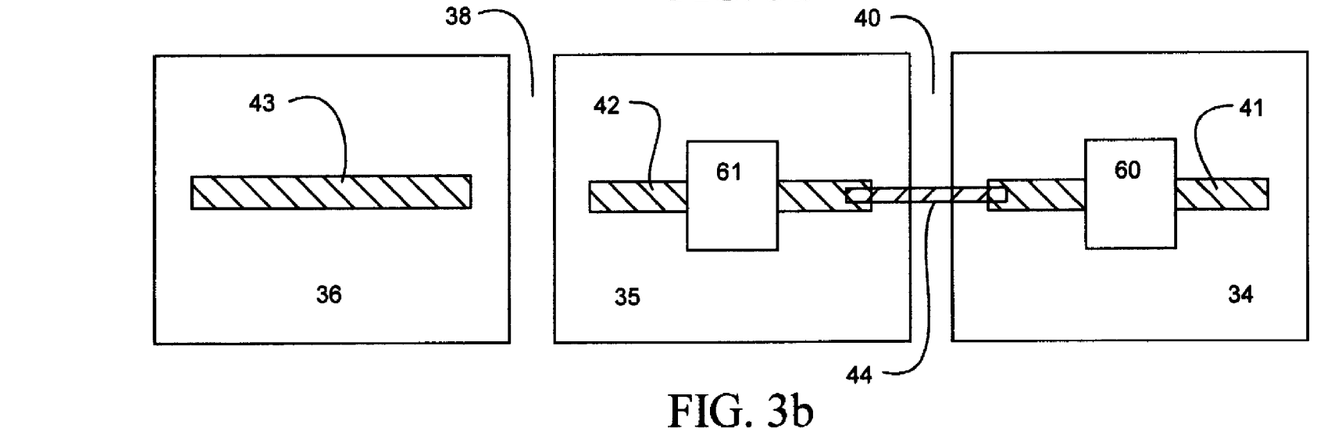

FIGS. 3a–b illustrate an electrical system, and in particular, a microwave system 70 according to the present invention. Microwave system 70 includes a plurality of microwave circuits. For example, block diagrams of microwave circuit 60 and 61 positioned on substrates 34 and 35 are shown in FIG. 3b. It should be understood that in complex microwave systems, many more microwave circuits may be present and only block diagrams representing microwave circuits 61 and 60 are shown.

For example, microwave circuit 61 may be an amplifier and microwave circuit 60 may be an antenna. Other microwave circuits may include, for example, switches, circulators and filters. Microwave circuit 60 may be coupled to other circuits and/or electronic devices on substrate 34 or on other substrates by a microstrip transmission line 41. Likewise, circuit 61 may be coupled to other circuits and/or electric devices on substrate 35 by microstrip transmission line 42. Substrate 36 is shown with a microstrip transmission line 43. Typically, microstrip transmission lines 41, 42 and 43 have an impedance of approximately 50 ohms.

In an embodiment, microstrip transmission lines 41, 42 and 43 consist of alumina or a high frequency plastic which is able to carry microwave signals, such as a 75 gHz signal. Typically, the microstrip transmission lines have an impedance of approximately 50 ohms. In other embodiments, microstrip transmission lines 41, 42 and 43 may be made of Teflon fiberglass or Duroid®.

As can be seen by FIG. 3a, electronic circuits and/or electrical devices are positioned on substrates 34, 35 and 36 which are then coupled to carriers 31(a–b), 32(a–b) and 33(a–b), respectively. In an embodiment, carriers 31, 32 and 33 consist of a ceramic. In the preferred embodiment, carriers 31, 32 and 33 consist of a metal, such as brass.

As described above, carriers 31, 32 and 33 are used for: 1) increasing heat sink characteristics; 2) providing a better ground for circuits and/or electronic devices; 3) strengthening the substrate (microwave circuits tend to be small and fragile); 4) allowing for a screw to be positioned between a substrate and a base; 5) allowing ease of replacement; and 6) allowing for common height if different substrate thicknesses are used.

As can be seen in FIG. 3a, carriers 33 and 32 are coupled to base 30, forming an opening 38 between carrier upper portion 33a and carrier upper portion 32a. In an embodiment, base 30 may be a part of a housing for microwave system 70. Likewise, opening 37 is formed between base 30 and carrier lower portions 33b and 32b. Similarly, opening 40 is formed between carrier upper portions 32a and 31a, while opening 39 is formed between carrier lower portions 32b and 31b and base 30. Base 30 acts as a ground plane for microwave system 70.

In an embodiment, the depth 71 of carriers 33, 32 and 31 is approximately 0.5 mm.

Microwave system 70 is manufactured by positioning the carriers 33, 32 and 31 on base 30. The various microwave circuits and/or electrical devices on substrates 34, 35 and 36 are coupled electronically between substrates by a jumper. For example, jumper 44 couples microwave circuit 60 on substrate 34 to microwave circuit 61 on substrate 35.

In an embodiment, jumper 44 is soldered to microwave transmission line 42 on substrate 35 and to microwave transmission line 41 on substrate 34. In an embodiment, jumper 44 consists of gold. Typically, jumper 44 has an impedance higher than the microwave transmission lines 41, 42 and, 43. Jumper 44 has an impedance of greater than approximately 100 ohms.

As described above in regard to the related art, the high impedance jumper between substrates and relatively thick carriers may cause undesirable signal quality degradation when transmitting a high frequency signal between carriers. For example, the relatively thick carriers cause a ground path between carriers 32 and 31 equal to twice the distance 71.

Figure 5:
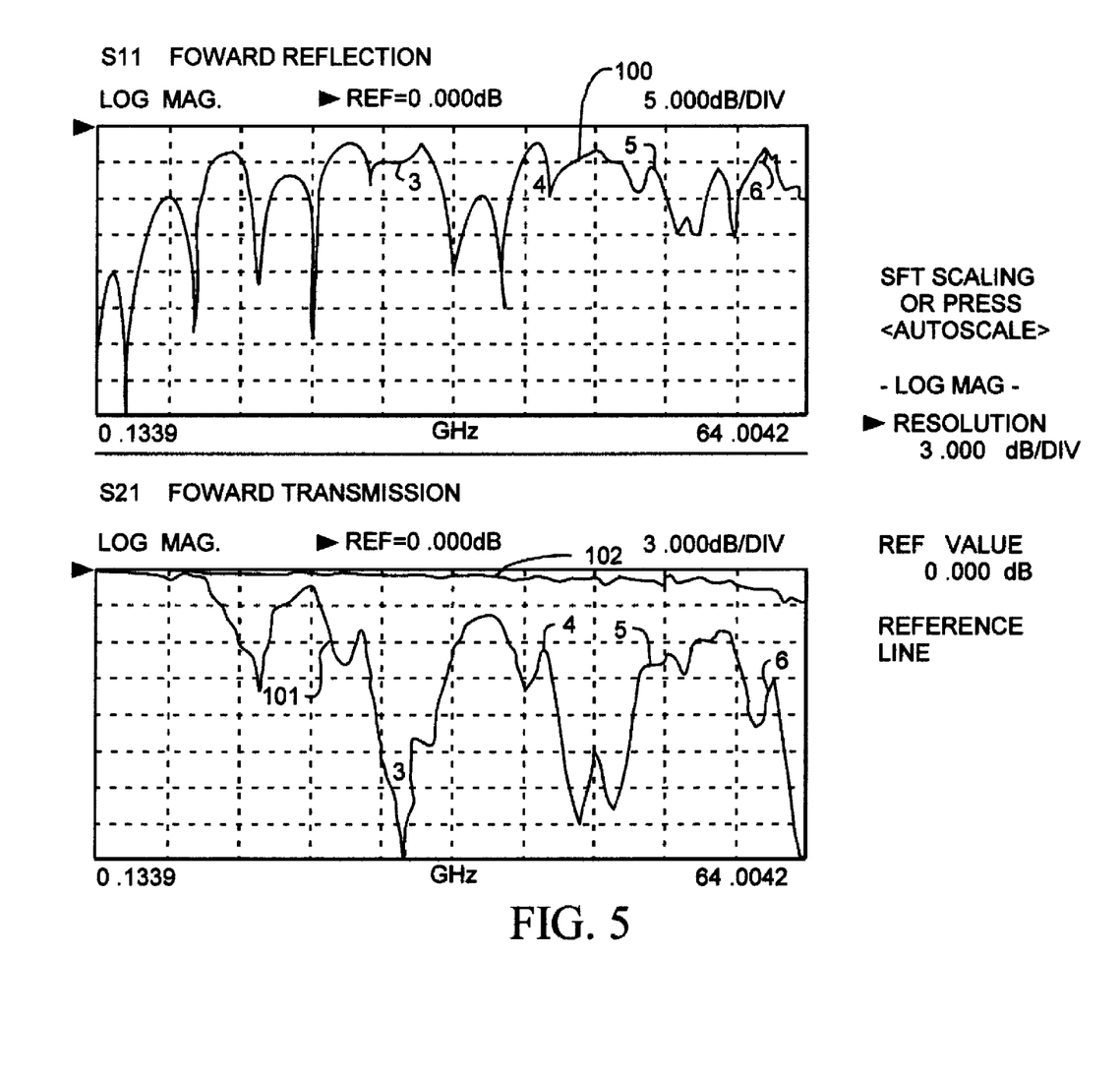
FIG. 5 illustrates enhanced forward transmission using the ground apparatus illustrated in FIGS. 3–5 according to the present invention.

FIG. 5 illustrates the forward reflection when transmitting microwave signals in microwave system 70, as illustrated in FIG. 3a. As can be seen by the curve 100 in FIG. 5, substantial forward reflection occurs for high frequency signals transmitted on microwave transmission lines 42 and 41 and jumper 44. Forward reflection was measured for microwave signals between approximately 0.13 gHz and 64 gHz. Forward reflection generally increases as frequency increases. Similarly, curve 101 illustrates forward transmission loss as frequency increases between approximately 0.13 gHz and 64 gHz.

Figure 4A:
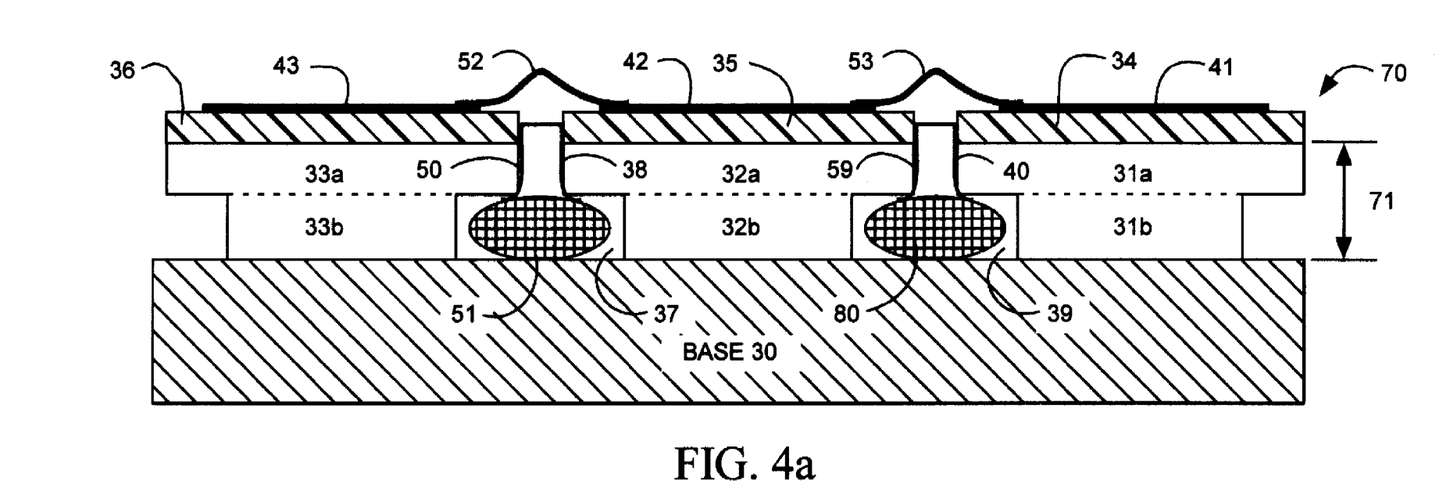
FIGS. 4a–b illustrate a ground for microwave circuits, including a ground spring and conductive rubber material, according to the present invention.
Figure 4B:
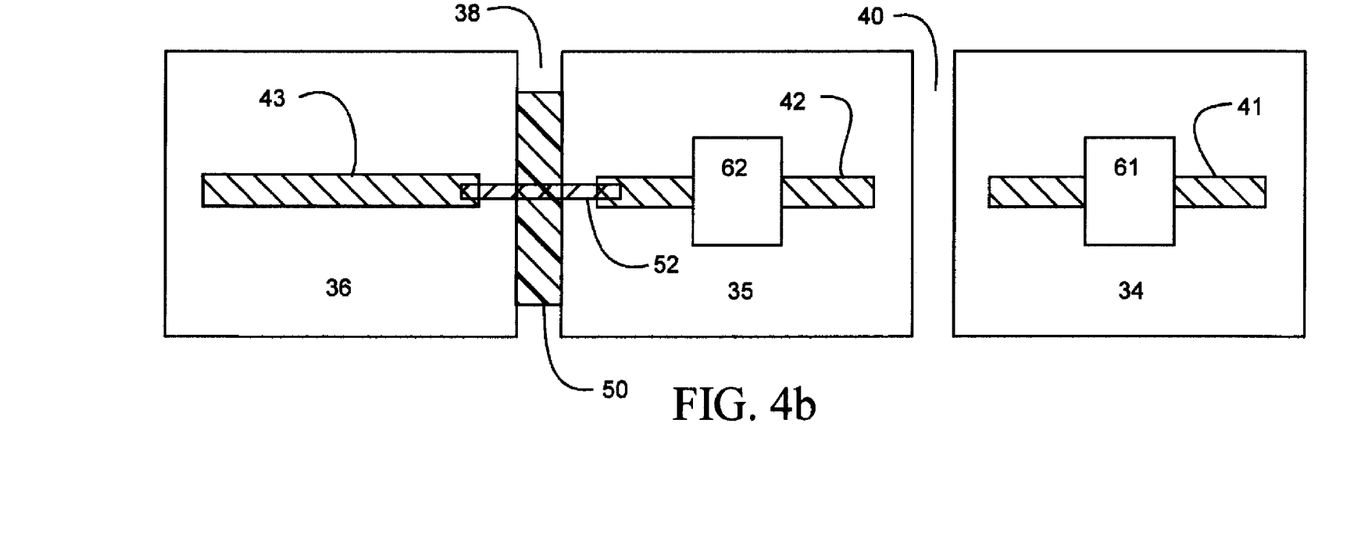

FIGS. 4a–b illustrate an apparatus for improving signal transmission quality for microwave systems having relatively thick carriers. In particular, the apparatus reduces forward reflection and increases forward transmission of microwave signals. FIGS. 4a–b illustrate the microwave system 70 having carriers 31, 32 and 33 coupled to base 30 acting as a ground plane. The carriers are used to position substrates 34, 35 and 36.

A conductive spring 50 is positioned in opening 38 between upper carrier portion 33a and upper carrier portion 32a. Likewise, a conductive spring 59 is positioned in opening 40 between upper carrier portion 32a and upper portion carrier 31a.

Conductive springs 50 and 59 are positioned such that the tops of conductive springs 50 and 59 are almost at the top of substrates 36, 35 and 34. Conductive springs 50 and 59 generally contact the edges of carriers 33, 32 and 31. However, it is not necessary that conductive springs 50 and 59 contact carriers 33, 32 and 31 because a ground is established by the pressure of conductive rubber materials 51 and 80 against base 30. In an embodiment, materials 51 and 80 may not be conductive.

In an embodiment, conductive springs 50 and 59 consist of beryllium copper. Other conductive spring-type material may also be used in an embodiment. Conductive springs 50 and 59 are adjusted to the optimum shape to be positioned in the openings 38 and 40. Conductive springs 50 and 59 and conductive rubber materials 51 and 80 allow for a low impedance when transmitting signals between substrates.

The carriers 31, 32 and 33 may be positioned on base 30 in order to form a specified distance for openings 38 and 40, allowing for positioning conductive springs 50 and 59. In the preferred embodiments, the distance of openings 38 and 40 between upper portion of carriers 33a, 32a and 31a is between approximately 0.006 and approximately 0.012 inches. The distance between substrates may vary by 20% with little degradation of signal quality.

The distance between conductive springs 50 and 59 and jumpers 52 and 53, respectively, can be adjusted slightly by bending jumpers 52 and 53. Ideally, the spaces between conductive springs 50 and 59 and jumpers 52 and 53 would provide an approximately 50 ohm impedance, respectively, (air dielectric microstrip transmission line), although, an impedance created between approximately 45 and 60 ohms would provide good results.

Figure 6:
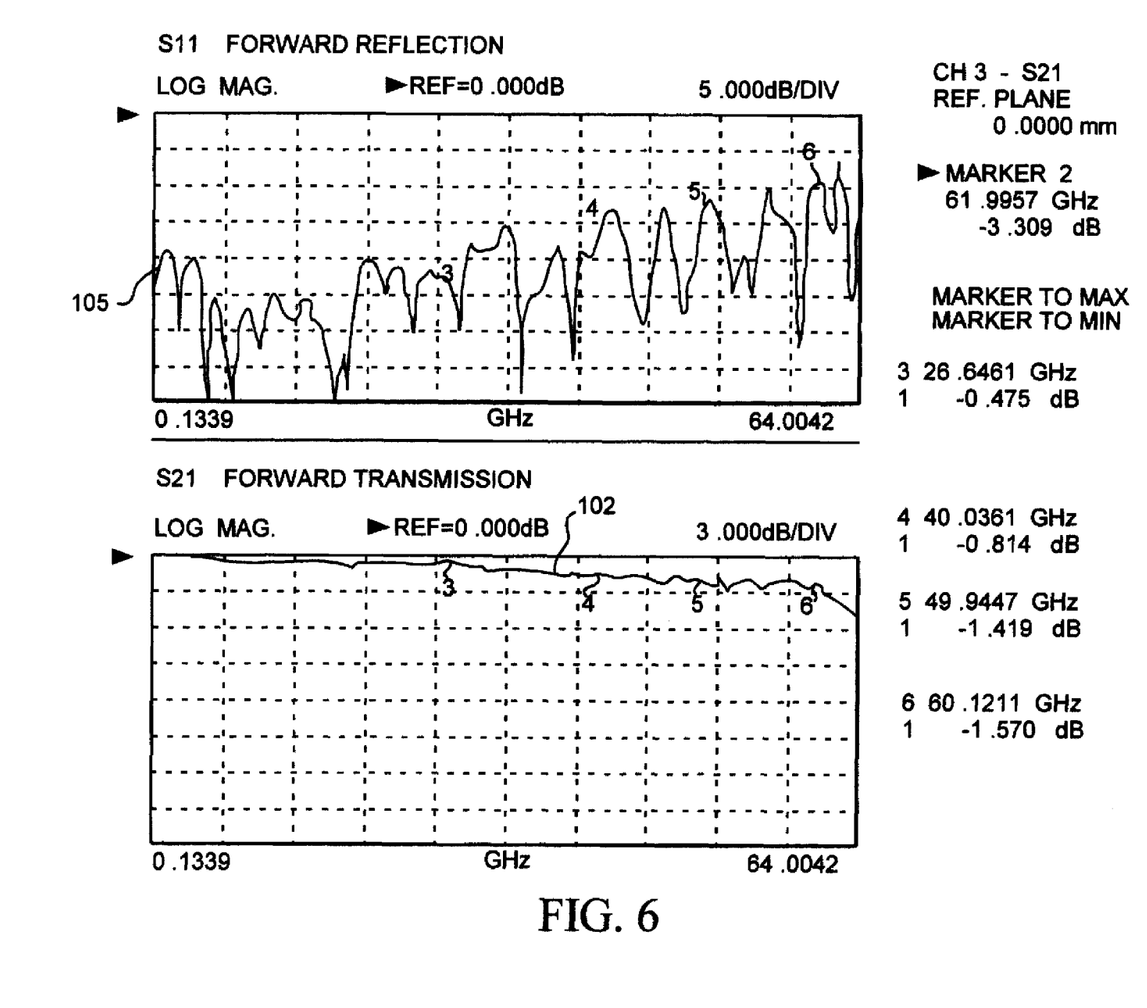
FIG. 6 illustrates reduced forward reflection using the ground apparatus as illustrated in FIGS. 3–5 according to the present invention.

FIGS. 5 and 6 illustrate the improved signal quality using the apparatus illustrated in FIGS. 4a–b. Curve 102 represents forward transmission when using the apparatus illustrated in FIGS. 4a–b, while curve 101 represents forward transmission when not using the apparatus. In particular, FIG. 5 shows a curve 102 which illustrates very little forward transmission loss as frequency increases from approximately 0.13 gHz to 64 gHz. A comparison of curve 102 with curve 101 shows a dramatic improvement in forward transmission when using the apparatus illustrated in FIGS. 4a–b. An approximately 21 db loss is observed at approximately 64 gHz when not using conductive springs 38 and 40 along with materials 51 and 80. Likewise, FIG. 6 illustrates an improved forward reflection curve 105 when using the apparatus shown in FIGS. 4a–b as compared to not using the apparatus as seen by curve 100 in FIG. 5. An approximately 3 db loss can be observed at approximately 62 gHz when not using the ground apparatus.

Thus, an apparatus for providing a ground path for circuits used with substrates having relatively thick carriers enables improved signal quality while achieving the benefits of carriers.

The foregoing description of the preferred embodiments of the present invention has been provided for the purposes of illustration and description. It is not intended to be exhaustive or to limit the invention to the precise forms disclosed. Obviously, many modifications and variations will be apparent to practitioners skilled in the art. The embodiments were chosen and described in order to best explain the principles of the invention and its practical applications, thereby enabling others skilled in the art to understand the invention for various embodiments and with the various modifications as are suited to the particular use contemplated. It is intended that the scope of the invention be defined by the following claims and their equivalents.

What is claimed is:

1. An apparatus for providing a ground path, comprising:
   a) a first carrier coupled to a first substrate including a first trace;
   b) a second carrier coupled to a second substrate including a second trace;
   c) a base coupled to the first carrier and the second carrier forming an opening between the first and second carrier;
   d) a conductive element coupling the first trace to the second trace; and,
   e) a conductive spring positioned in the opening, wherein the spring contacts the first substrate and the second substrate.

2. The apparatus of claim 1, wherein the first and second traces are microstrip transmission lines.

3. The apparatus of claim 1, wherein the first substrate and the second substrate include a first top surface and a second top surface, respectively, and the conductive spring is bent near the first top surface and the second top surface.

4. The apparatus of claim 1, wherein the first substrate and the second substrate have a first end surface and a second end surface, respectively, forming the opening and the spring contacts the first end surface and the second end surface.

5. The apparatus of claim 1, wherein the apparatus transfers a microwave signal ranging from approximately 0.13 gHz to approximately 64 ghz.

6. The apparatus of claim 1, wherein the first and second carriers consist of metal.

7. The apparatus of claim 1, wherein the first and second carriers have a thickness of approximately 0.5 mm.

8. The apparatus of claim 1, wherein the conductive element is a jumper soldered onto the first and second carriers and consists of gold.

9. The apparatus of claim 1, wherein the conductive spring element consists of beryllium copper.

10. The apparatus of claim 1, wherein the conductive spring is flexible in order to be positioned into the opening and contact the first and second carriers.

11. The apparatus of claim 1, wherein the position of the conductive spring enables an impedance between the first and second carrier ranging from approximately 45 approximately 60 ohms.

12. The apparatus of claim 1, further comprising:
   a conductive rubber material, positioned in the opening, contacting the conductive spring and the base.

13. An apparatus for providing a ground path for microwave circuits, comprising:
   a) a first carrier coupled to a first substrate having a first microwave circuit including a first microstrip transmission line, wherein the first carrier includes a first upper portion for positioning the first substrate and a lower portion;
   b) a second carrier coupled to a second substrate having a second microwave circuit including a second microstrip transmission line, wherein the second carrier includes a first upper portion for positioning the second substrate and a lower portion;
   c) a base, coupled to: 1) the lower portion of the first carrier; and 2) the lower portion of the second carrier, forming: 1) a first opening between the upper portions of the first and second carriers; and 2) a second opening between the lower portions of the first and second carriers;
   d) a jumper coupled to the first microstrip transmission line and the second microstrip transmission line;
   e) a conductive spring positioned in the first opening; and,
   f) a conductive rubber material, positioned in the second opening, contacting the conductive spring and the base.

14. The apparatus of claim 13, wherein the first substrate and the second substrate includes a first top surface and a second top surface, respectively, and the conductive spring is bent near the first top surface and the second top surface.

15. The apparatus of claim 13, wherein the first substrate and the second substrate have a first end surface and second end surface, respectively, forming the first opening and the spring contacts the first end surface and second surface.

16. The apparatus of claim 13, wherein the apparatus transfers a microwave signal ranging from approximately 0.13 gHz to approximately 64 gHz.

17. The apparatus of claim 13, wherein the first and second carriers consist of metal.

18. The apparatus of claim 13, wherein the first and second carriers have a thickness of approximately 0.5 mm.

19. The apparatus of claim 13, wherein the jumper is soldered onto the first and second carriers and consists of gold.

20. The apparatus of claim 13, wherein the conductive spring consists of beryllium copper.

21. The apparatus of claim 13, wherein the conductive spring is flexible in order to be positioned into the first opening and contact the first and second substrates.

22. The apparatus of claim 13, wherein the position of the conductive spring enables an impedance between the first and second carrier ranging from approximately 45 to approximately 60 ohms.

* * * * *

UNITED STATES PATENT AND TRADEMARK OFFICE
CERTIFICATE OF CORRECTION

PATENT NO. : 5,812,039
DATED : September 22, 1998
INVENTOR(S) : William Oldfield It is certified that error appears in the above-indentified patent and that said Letters Patent is hereby corrected as shown below:

Column 6, line 37, after "45" and before "approximately", please add the word --to--.

Signed and Sealed this

Twenty-ninth Day of December, 1998

Attest:

BRUCE LEHMAN

Attesting Officer

Commissioner of Patents and Trademarks